US 11,863,899 B2

(12) United States Patent
Zhao et al.

(10) Patent No.: US 11,863,899 B2
(45) Date of Patent: Jan. 2, 2024

(54) CMOS IMAGE SENSOR, IMAGE SENSOR UNIT AND SIGNAL TRANSMISSION METHODS THEREFOR

(71) Applicant: SHANGHAI IC R & D CENTER CO., LTD., Shanghai (CN)

(72) Inventors: Yuhang Zhao, Shanghai (CN); Jianxin Wen, Shanghai (CN); Changming Pi, Shanghai (CN); Xi Zeng, Shanghai (CN); Ling Shen, Shanghai (CN)

(73) Assignees: Shanghai IC R&D Center Co., Ltd., Shanghai (CN); Shanghai Integrated Circuit Equipment & Materials Industry Innovation Center Co., Ltd, Shanghai (CN)

( * ) Notice: Subject to any disclaimer, the term of this patent is extended or adjusted under 35 U.S.C. 154(b) by 294 days.

(21) Appl. No.: 17/602,819

(22) PCT Filed: Dec. 30, 2019

(86) PCT No.: PCT/CN2019/129809
§ 371 (c)(1),
(2) Date: Oct. 11, 2021

(87) PCT Pub. No.: WO2020/207062
PCT Pub. Date: Oct. 15, 2020

(65) Prior Publication Data
US 2022/0159209 A1    May 19, 2022

(30) Foreign Application Priority Data

Apr. 11, 2019  (CN) .............................. 201910289679
Apr. 24, 2019  (CN) .............................. 201910333253

(51) Int. Cl.
*H04N 25/78*    (2023.01)
*H04N 25/771*   (2023.01)
*H04N 25/79*    (2023.01)

(52) U.S. Cl.
CPC ........... *H04N 25/78* (2023.01); *H04N 25/771* (2023.01); *H04N 25/79* (2023.01)

(58) Field of Classification Search
CPC ........ H04N 25/75; H04N 25/76; H04N 25/77; H04N 25/771; H04N 25/772; H04N 25/78; H04N 25/79
See application file for complete search history.

(56) References Cited

U.S. PATENT DOCUMENTS

2021/0281781 A1*  9/2021  Suri .................... H04N 25/573

FOREIGN PATENT DOCUMENTS

| CN | 103248837 A  * | 8/2013 |
| CN | 103248837 A1   | 8/2013 |

(Continued)

OTHER PUBLICATIONS

Machine Translation of CN-109587417-A (Year: 2019).*
Machine Translation of CN-103248837-A (Year: 2013).*

*Primary Examiner* — Daniel M Pasiewicz
(74) *Attorney, Agent, or Firm* — Andrew C. Cheng (57) ABSTRACT

The disclosure discloses a CMOS image sensor, which includes a plurality of image sensor units and a resistance-to-digital converting unit. Each image sensor unit includes a pixel unit and a resistive random access memory unit connected to the pixel unit, the pixel unit is configured to convert a received optical signal into an analog signal and the resistive random access memory unit is configured to convert the analog electrical signal into a resistance value. The resistance-to-digital converting unit is connected to the plurality of the image sensor units, and is configured to convert the resistance value into a digital signal. The resis- (Continued)

tive random access memory unit is adopted in the present disclosure to replace a transistor device and is configured to convert resistance information of the resistive random access memory unit into a digital signal and output. Thus, digital quantization of image information is completed.

20 Claims, 5 Drawing Sheets

(56) References Cited

FOREIGN PATENT DOCUMENTS

| | | | | | |
|---|---|---|---|---|---|
| CN | 109587417 | A | * | 4/2019 | ....... H01L 27/14634 |
| CN | 109587417 | A1 | | 4/2019 | |

* cited by examiner

CMOS IMAGE SENSOR, IMAGE SENSOR UNIT AND SIGNAL TRANSMISSION METHODS THEREFOR

CROSS-REFERENCE TO RELATED APPLICATION

The present application claims the priority of International Patent Application Serial No. PCT/CN2019/129809, filed Dec. 30, 2019, which is related to, and claims the priority of a Chinese patent application CN 201910333253.3 filed on Apr. 24, 2019 and a Chinese patent application CN 201910289679.3 filed on Apr. 11, 2019, contents of which are incorporated herein by reference and made a part of this specification.

TECHNICAL FIELD

The present application relates to the technical field of image sensors, and more particularly, to a CMOS image sensor pixel unit, an image sensor unit and a signal transmission method therefor.

BACKGROUND

With the development of CMOS integrated circuit manufacturing processes, electronic products are more and more widely used in daily life. As information collecting ports of electronic products, image sensors provide essential technical support for development of various fields, such as daily life, transportation, aerospace research, intelligence application of AI and etc. In practical applications, image sensors with high frame rate may provide more accurate and real-time image information, and may play important roles in fields such as intelligent driving, rapid recognition, and accurate capture.

However, the numbers of pixels of current CMOS image sensors are increased continuously, making data volumes of the image sensors increased dramatically. Thus, it is required to provide the current CMOS image sensors with more storage chips to store mass data in the CMOS image sensors, which will inevitably increase difficulty in designing and manufacturing the chips. Additionally, signals of the current CMOS image sensors are stored digitally, and the scale of a storage circuit is determined by the number of pixels and the quantization bit number of an analog-to-digital converting circuit. Thus, the scale of the storage circuit is made relatively great, a relatively large area is occupied and cost of the chips is increased.

SUMMARY

The objective of the present disclosure is to overcome the shortcomings of the prior arts and provide a CMOS image sensor that may save image information relatively fast and relatively long.

To achieve the above objective, the present disclosure provides a CMOS image sensor, including:

a plurality of image sensor units, each of the plurality of image sensor units including a pixel unit and a resistive random access memory unit (RRAM unit) connected to the pixel unit, the pixel unit configured to convert a received optical signal into an analog electrical signal and output the analog electrical signal, and the RRAM unit configured to convert the analog electrical signal into a resistance value; and a resistance-to-digital converting unit, connected to the plurality of the image sensor units and configured to convert the resistance value into a digital signal; wherein the resistance-to-digital converting unit includes a resistance-to-voltage converting module configured to convert the resistance value into a voltage value and an analog-to-digital converting module configured to converting the voltage value into a digital signal.

Preferably, the RRAM unit includes at least one resistive random access memory (RRAM) and a logic circuit configured to control reading and writing of the at least one RRAM, an upper electrode of the RRAM is connected to an output terminal of the logic circuit, and a lower electrode of the RRAM is connected to a variable external voltage.

Preferably, the pixel unit comprises a photodiode, a transmission transistor, and a reset transistor, a source of the transmission transistor is connected to the photodiode, both a drain of the transmission transistor and a source of the reset transistor are connected to a floating diffusion area, and an input terminal of the logic circuit is connected to the floating diffusion area.

Preferably, the logic circuit includes a row selecting transistor, a drain of the row selecting transistor is connected to the floating diffusion area, and a source of the row selecting transistor is connected to the upper electrode of the RRAM.

Preferably, the resistance-to-voltage converting module includes: an operational amplifier, comprising a first input terminal, a second input terminal, and an output terminal, the first input terminal connected to the upper electrode of the RRAM; and a resistor, connected across the first input terminal and the output terminal of the operational amplifier.

Preferably, the pixel unit is correspondingly connected to one of the at least one RRAM through the logic circuit.

Preferably, the pixel unit is correspondingly connected to more than one of the at least one RRAM through the logic circuit.

Preferably, the logic circuit further includes a plurality of switching transistors connected to the row selecting transistor, wherein the plurality of switching transistors are connected to more than one of the at least one RRAM in one-to-one correspondence.

Preferably, the pixel units of the plurality of image sensor units are arranged in array, the CMOS image sensor further includes a control unit, for a frame image, the control unit sequentially selects respective rows of the pixel unit array, and controls the pixel units of a selected row to simultaneously output the analog electrical signal to the RRAM correspondingly connected.

Preferably, the pixel units of the plurality of image sensor units are arranged in array, the CMOS image sensor further includes a control unit, for a frame image, the control unit selects respective rows of the pixel unit array at the same time, and controls the pixel units of the selected respective rows to simultaneously output an analog electrical signal to the RRAM correspondingly connected, and controls the resistance values stored in the RRAMs respectively connected to the pixel units of the selected respective rows to be output sequentially to the resistance-to-digital converting unit correspondingly connected.

According to another aspect of the present disclosure, a signal transmission method for the CMOS image sensor as described above is further provided, the pixel units of the plurality of image sensor units are arranged in array, and the signal transmission method includes: selecting each row of the pixel units arranged in array sequentially, and controlling the pixel units of the selected row to simultaneously output the analog electrical signals to the RRAM correspondingly connected.

According to another aspect of the present disclosure, a signal transmission method for the CMOS image sensor as described above is further provided, the pixel units of the plurality of image sensor units are arranged in an array, and the signal transmission method includes: selecting respective rows of the pixel unit array at the same time, controlling the pixel units of the selected respectively rows to simultaneously output an analog electrical signal to the correspondingly connected RRAM, and controlling a resistance value stored in respective RRAMs connected to the pixel units of the selected respective rows to be output sequentially to the resistance-to-digital converting unit correspondingly connected.

According to another aspect of the present disclosure, an image sensor unit is provided, including: a pixel unit and a resistive random access memory unit (RRAM unit) connected to the pixel unit. The pixel unit includes a photodiode, a transmission transistor, and a reset transistor; the photodiode is configured to convert a received optical signal into an analog electrical signal, a source of the transmission transistor is connected to the photodiode, and both a drain of the transmission transistor and a source of the reset transistor are connected to a floating diffusion area. The RRAM unit includes at least one resistive random access memory (RRAM) configured to convert the analog electrical signal into a resistance value and a logic circuit configured to control reading and writing of the at least one RRAM, an input terminal of the logic circuit is connected to the floating diffusion area, and an output terminal of the logic circuit is connected to an upper electrode of the RRAM; a lower electrode of the RRAM is connected to a variable external voltage.

Preferably, the logic circuit includes a row selecting transistor, a drain of the row selecting transistor is connected to the floating diffusion area, and a source of the row selecting transistor is connected to the upper electrode of the RRAM.

Preferably, the logic circuit further comprises a plurality of switching transistors connected to the row selecting transistor, wherein the plurality of switching transistors are connected to the RRAMs in a one-to-one correspondence.

According to another aspect of the present disclosure, a signal transmission method for an image sensor unit is further provided, including following steps:
 S1: turning on the transmission transistor and the reset transistor to make the photodiode in a reset state; setting a voltage of a lower electrode of the RRAM to a first voltage;
 S2: turning off the transmission transistor, and the photodiode starting to be exposed;
 S3: increasing the voltage of the lower electrode of the RRAM to a second voltage, wherein a difference between the second voltage and a voltage of an upper electrode of the RRAM is less than a voltage threshold at which a resistance state of the RRAM is changed;
 S4: turning off the reset transistor, and maintaining a voltage of the floating diffusion region at a first sampled voltage;
 S5: writing the first sampled voltage to the upper electrode of the RRAM and maintaining;
 S6: reading a first resistance value of the RRAM, wherein the first resistance value corresponds to the first sampled voltage;
 S7: turning on the transmission transistor to decrease the voltage of the floating diffusion area to a second sampled voltage;
 S8: turning off the transmission transistor;
 S9: writing the second sampled voltage to the RRAM and maintaining; and
 S10: reading a second resistance value of the RRAM, wherein the second resistance value corresponds to the second sampled voltage.

Preferably, S5 includes:
 S51: controlling the logic circuit to write the first sampled voltage to the RRAM, and decreasing the voltage of the lower electrode of the RRAM to a third voltage, wherein a difference between the third voltage and the voltage of the upper electrode of the RRAM is greater than the voltage threshold;
 S52: increasing the voltage of the lower electrode of the RRAM to the second voltage, so that a difference between the voltage of the upper electrode and the voltage of the lower electrode of the RRAM is less than the voltage threshold; and S9 includes:
 S91: controlling the logic circuit to write the second sampled voltage into the RRAM, and decreasing the voltage of the lower electrode of the RRAM to the third voltage; and
 S92: increasing the voltage of the lower electrode of the RRAM to the second voltage, so that the difference between the voltage of the upper electrode and the voltage of the lower electrode of the RRAM is less than the voltage threshold.

According to another aspect of the present disclosure, a signal transmission method for an image sensor unit is provided, including:
 S1: turning on a transmission transistor and a reset transistor to make a photodiode in a reset state; and setting a voltage of a lower electrode of a resistive random access memory (RRAM) to a first voltage;
 S2: turning off the transmission transistor, and the photodiode starting to be exposed;
 S3: increasing the voltage of the lower electrode of the RRAM to a second voltage, wherein a difference between the second voltage and a voltage of an upper electrode of the RRAM is less than the voltage threshold at which a resistance state of the RRAM is changed;
 S4: turning off the reset transistor, and maintaining a voltage value of a floating diffusion area at a first sampled voltage;
 S5: writing the first sampled voltage to the upper electrode of the RRAM and maintaining;
 S6: reading a first resistance value of the RRAM, wherein the first resistance value corresponds to the first sampled voltage;
 S7: turning on the transmission transistor to decrease the voltage of the floating diffusion area to a second sampled voltage;
 S8: turning off the transmission transistor;
 S9: writing the second sampled voltage to the RRAM and maintaining; and
 S10: reading a second resistance value of the RRAM, wherein the second resistance value corresponds to the second sampled voltage.

Preferably, S5 includes:
 S51: turning on a row selecting transistor, writing the first sampled voltage to the RRAM, and decreasing the voltage of the lower electrode of the RRAM to a third voltage, wherein a difference between the third voltage and the voltage of upper electrode of the RRAM is greater than the voltage threshold; and S52: turning off the row selecting transistor, and increasing the voltage of the lower electrode of the RRAM to the second voltage, so that a difference between the voltage of the upper electrode of the RRAM and the voltage of the lower electrode of the RRAM is less than the threshold voltage;

S9 including:

S91: turning on the row selecting transistor, writing the second sampled voltage to the RRAM, and decreasing the voltage of the lower electrode of the RRAM to the third voltage; and S92: turning off the row selecting transistor, and increasing the voltage of the lower electrode of the RRAM to the second voltage, so that the difference between the voltage of the upper electrode of the RRAM and the voltage of the lower electrode of the RRAM is less than the voltage threshold.

Preferably, the signal transmission method for the image sensor unit further including:

S11: turning on the transmission transistor and the reset transistor, and decreasing the voltage of the lower electrode of the RRAM to the first voltage.

With respect to the prior arts, the present disclosure further proposes a new resistance quantization architecture, which converts the resistance information of the RRAM into a digital signal and outputs, thereby completing the digital quantization of the image information. Furthermore, the image sensor unit according to the present disclosure adopts an RRAM to replace a transistor device with a relatively larger area. Since the RRAM is grown between two metal layers, it does not occupy area of the active area, which can increase filling rate and improve the sensitivity of the image sensor. In addition, the voltage signal obtained by exposure is directly stored in the RRAM, signal transmission rate of the image sensor is further improved.

DETAILED DESCRIPTION

The content of the present disclosure will be further described in detail hereinafter in conjunction with the accompanying drawings of the specification. It should be understood that the present disclosure may have various variants in different examples, which do not depart from the scope of the present disclosure, and the descriptions and drawings therein are intended for illustrative purposes in nature, rather than limiting the present disclosure. It should be noted that the drawings are illustrated in very simplified forms and with imprecise scales, and are only intended to assist in explaining the purpose of the embodiments of the present disclosure conveniently and clearly.

Figure 1:
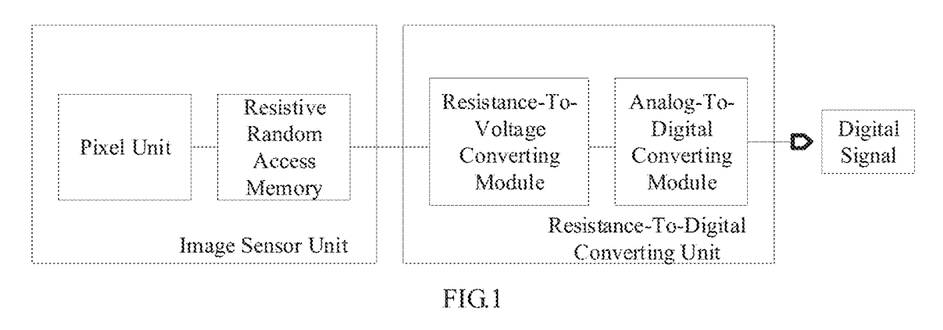
FIG. 1 illustrates a block diagram of a CMOS image sensor according to the present disclosure.

Please refer to FIG. 1, which illustrates a block diagram of a CMOS image sensor according to the present disclosure. The CMOS image sensor includes a plurality of image sensor units and a resistance-to-digital converting unit. Each of the plurality of image sensor units is configured to convert a received optical signal into a resistance value, and the resistance-to-digital converting unit is configured to convert the resistance value into a digital signal.

Figure 2:
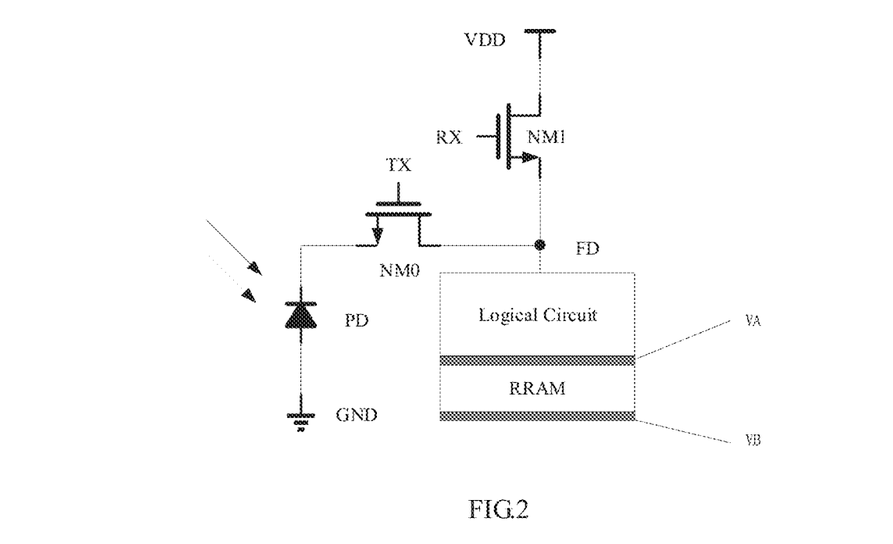
FIG. 2 illustrates a schematic view of a circuit structure of an image sensor unit according to the first embodiment of the present disclosure.

For example, as illustrated in FIGS. 1 and 2, in an embodiment of the present disclosure, each of the plurality of image sensor units includes a pixel unit and a resistive random access memory unit (RRAM unit) connected to the pixel unit. The pixel unit is configured to convert a received optical signal into an analog electric signal and output it, and the pixel unit includes a photodiode PD, a transmission transistor NM0 and a reset transistor NM1. The photodiode PD is configured to convert the received optical signal into an analog electric signal, the transmission transistor NM0 is configured to control transmission of charge signals generated by the photodiode, and the reset transistor NM1 is configured to reset of an electric signal. An anode of the photodiode is connected to the ground GND, a cathode of the photodiode is connected to a source of the transmission transistor NM0; a drain of the transmission transistor NM0 is connected to a source of the reset transistor NM1 at a floating diffusion area; a drain of the reset transistor NM1 is connected to a power supply VDD.

The RRAM unit includes at least one resistive random access memory (RRAM) and a logic circuit. The logic circuit is configured to control writing or reading of RRAM signals. The RRAM have various resistance values according to various written voltage signals, so as to achieve storage of various voltage signals. In this embodiment, the RRAM indicates a multi-value RRAM. The RRAM has a sandwich structure including an upper electrode, a lower electrode and a resistance converting layer. Each of the upper electrode and the lower electrode is a metal layer epitaxially grown on a silicon substrate, and the resistance converting layer is made of a special material grown between the two metal layers. In a case that a difference between a voltage of the upper electrode and a voltage of the lower electrode of the RRAM is greater than a voltage threshold, a resistance value of the RRAM is changed with the difference between the voltages of two terminals of the RRAM. The greater the difference between the voltages of the two terminals of the RRAM, the less the resistance value of the RRAM. In a case that the difference between the voltages of the two terminals of the RRAM is less than the voltage threshold, the resistance value of the RRAM is maintained. The voltage threshold mentioned here indicates a voltage value at which a state of the resistance of the RRAM is changed, and is also referred to as a transition voltage. In this embodiment, the logic circuit is connected to the metal layer of the upper electrode of the RRAM, so the voltage of the metal layer is determined by operation condition of the photodiode. The metal layer of the lower electrode of the RRAM is connected to a variable external voltage. Thus, a resistance between the two metal layers is the resistance value of the RRAM. As the lower electrode of the RRAM is connected to the variable external voltage to receive an external voltage that is variable, the resistance value of the RRAM may be directly related to respective voltage states all the time by adjusting the external voltage, so that the resistance value of the RRAM can be used to characterize the voltage states.

The CMOS image sensor may further include a control unit that may control ON/OFF of the transmission transistor NM0, ON/OFF of the reset transistor NM1, ON/OFF of the logic circuit, and the voltage (i.e., the external voltage) of the lower electrode of the RRAM, so that the RRAM may store an analog electrical signal output by the photodiode after reset or exposure correspondingly. In this embodiment, a gate of the transmission transistor NM0 is configured to receive a TX signal, a gate of the reset transistor NM1 is configured to receive an RX signal, and the control unit is configured to control the TX signal and the RX signal, thereby controlling the ON/OFF of respective transistors.

Figure 3:
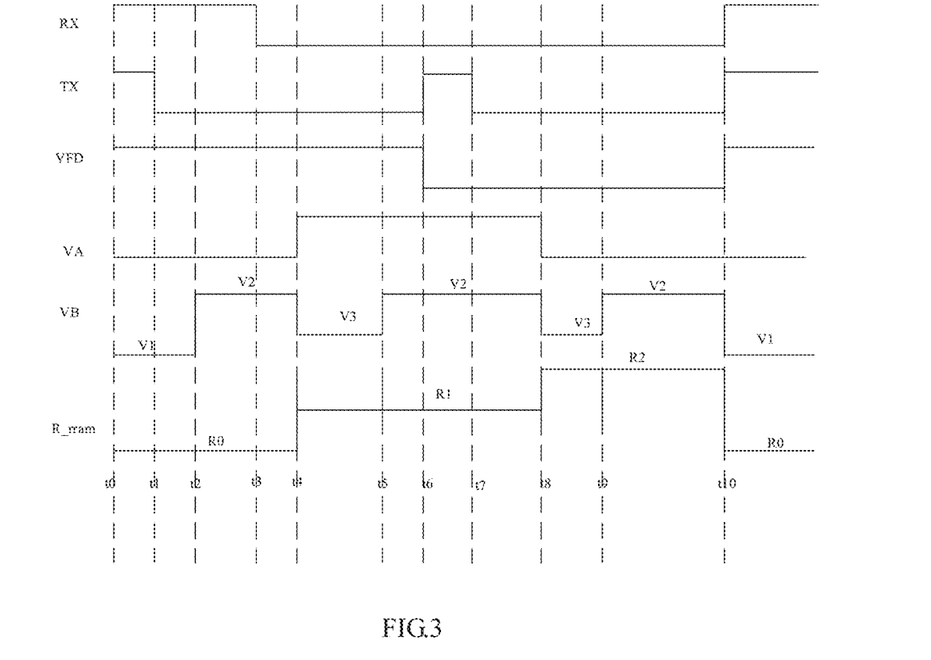
FIG. 3 illustrates a timing diagram of signal transmission of the image sensor unit according to the first embodiment of the present disclosure.

FIG. 3 illustrates a timing diagram of signal transmission of an individual image sensor unit according to this embodiment. As illustrated in the figure:

At time t0, both the RX signal and the TX signal are high voltages, both the transmission transistor and the reset transistor are turned ON, and the photodiode is in a reset state. At this time, the external voltage VB connected to the lower electrode of the RRAM is maintained at a first voltage V1, and the resistance value of the RRAM is recorded as a reset resistance value R0.

At time t1, the TX signal is changed from the high voltage to a low voltage, the transmission transistor is turned OFF, and the photodiode starts to be exposed at this time.

At time t2, the external voltage VB is increased to a second voltage V2, and a difference between the second voltage V2 and a voltage of the upper electrode of the RRAM is less than the voltage threshold of the RRAM, and the resistance value R_rram of the RRAM is maintained at the reset resistance value R0 at this time.

At time t3, the RX signal is changed from the high voltage to the low voltage, and the reset transistor is turned OFF. At this time, the reset ends, and a voltage of the floating diffusion area VFD is maintained at the first sampled voltage, which is also referred to as a reset voltage.

At time t4, the logic circuit is controlled so that the first sampled voltage of the floating diffusion area is written to the upper electrode of the RRAM, that is, VA=VFD, the external voltage VB is decreased to a third voltage V3, and a difference between the third voltage V3 and the voltage of the upper electrode of the RRAM is greater than the voltage threshold of the RRAM. At this time, change in difference between the voltages of the upper electrode and the lower electrode of the RRAM makes the resistance value of the RRAM change to the first resistance value R1, which may represent a magnitude of the first sampled voltage, that is, the RRAM completes sampling of the first sampled voltage.

At time t5, the external voltage VB is increased to the second voltage V2 to guarantee that the difference between the voltages of the upper electrode and lower electrode of the RRAM is less than the voltage threshold of the RRAM. At this time, the resistance value R_rram of the RRAM is maintained at the first resistance value.

Therefore, a corresponding first sampled voltage may be obtained by reading the resistance value of the RRAM by performing a reading operation on the logic circuit of the RRAM.

At time t6, the TX signal is changed from the low voltage to the high voltage, the transmission transistor is turned ON, charges generated by the photodiode during the exposure stage is transmitted to the floating diffusion area, and the voltage of the floating diffusion area VFD is decreased to a second sampled voltage.

At time t7, the TX signal is changed from the high voltage to the low voltage, the transmission transistor is turned off, the voltage of the floating diffusion area is maintained at the second sampled voltage, and output of the charges generated by the photodiode is finished.

At time t8, the logic circuit is controlled so that the second sampled voltage of the floating diffusion area is written to the upper electrode of the RRAM, the external voltage VB is decreased to a third voltage V3, and a difference between the third voltage and the voltage of the upper electrode of the RRAM is greater than the voltage threshold of the RRAM. At this time, the change in the difference between the voltages of the two electrodes of the RRAM causes the resistance value of the RRAM to be changed to the second resistance value R2, which may represent a magnitude of the second sampled voltage, and sampling of the second sampled voltage by the RRAM is finished.

At time t9, the external voltage VB is increased to the second voltage V2 to ensure that the difference between the voltages of the two terminals of the RRAM is less than the voltage threshold of the RRAM. At this time, the resistance value of the RRAM is maintained at the second resistance value R2.

A corresponding second sampled voltage may be obtained by reading the resistance of the RRAM by performing reading operation on the logic circuit.

In addition, at time t10, the RX signal and TX signal can also be changed from the low voltage to the high voltage, the transmission transistor and the reset transistor are turned ON, and the external voltage is decreased to the second voltage V2, so that the circuit returns to the reset state for a next exposure.

Figure 4:
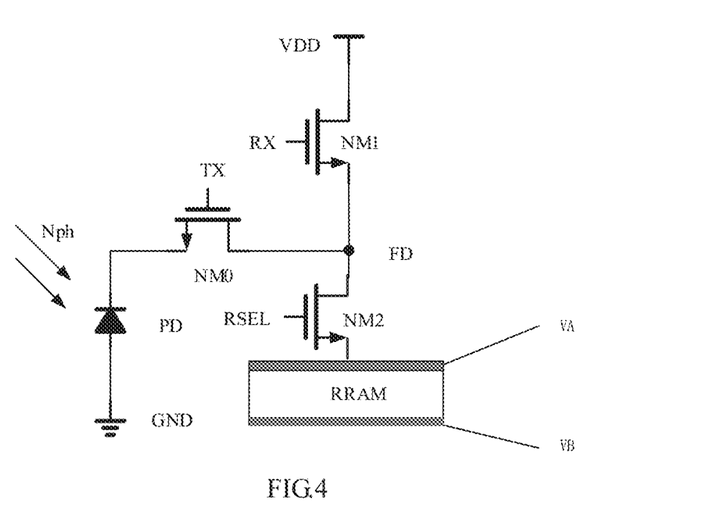
FIG. 4 illustrates a schematic view of a circuit structure of an image sensor unit according to the second embodiment of the present disclosure.

Please refer to FIG. 4, which is a schematic view of a circuit structure of an individual image sensor unit according to a second embodiment of the present disclosure. In this embodiment, a logic circuit of a resistive random access memory unit (RRAM unit) includes a row selecting transistor NM2, which is configured to control writing or reading of signals of a RRAM. A drain of the row selecting transistor NM2 is connected to a floating diffusion area, and a source of the row selecting transistor NM2 is connected to a metal layer of an upper electrode of the RRAM. A gate of the row selecting transistor NM2 is connected to receive a RSEL signal, and a control unit controls ON and OFF of the row selecting transistor NM2 by controlling the RSEL signal. The metal layer of the upper electrode of the RRAM is connected to the source of the row selecting transistor NM2, which can significantly reduce noise.

Figure 5:
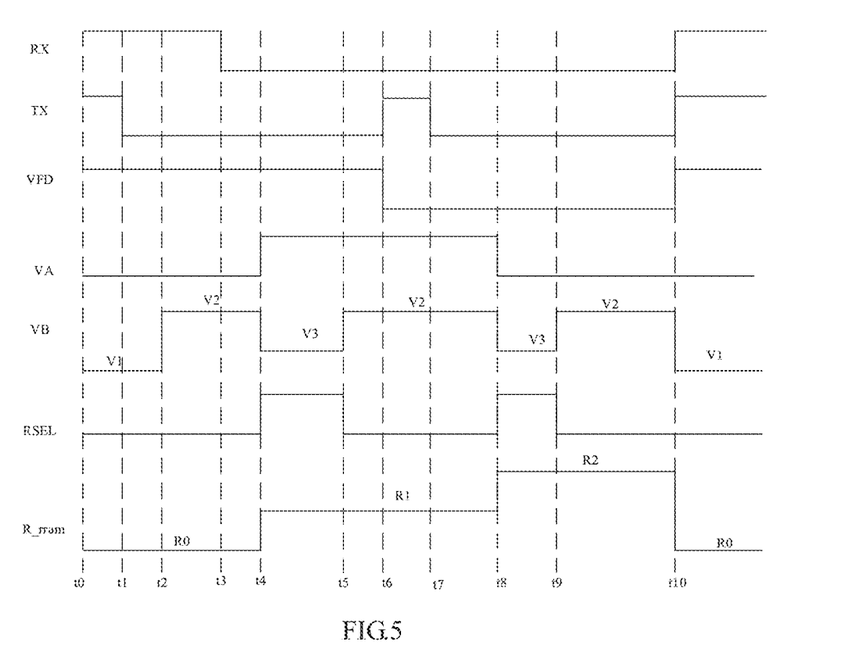
FIG. 5 illustrates a timing diagram of signal transmission of the image sensor unit according to the second embodiment of the present disclosure.

FIG. 5 illustrates a timing diagram of signal transmission of the image sensor unit according to this embodiment. As illustrated in the drawing:

At time t0, the RX signal and TX signal are both at a high voltage, the transmission transistor and the reset transistor are both turned ON, and the photodiode is in a reset state. At this time, an external voltage VB connected to a lower electrode of a RRAM is kept at a first voltage V1. At this time, a resistance value of the RRAM is recorded as a reset resistance value R0.

At time t1, the TX signal is changed from the high voltage to a low voltage, the transmission transistor is turned OFF, and the photodiode starts to be exposed at this time.

At time t2, the external voltage VB is increased to a second voltage V2, and a difference between the second voltage V2 and a voltage of an upper electrode of the RRAM is less than the voltage threshold of the RRAM, and a resistance value R_rram of the RRAM is maintained at the reset resistance value R0 at this time.

At time t3, the RX signal is changed from the high voltage to the low voltage, and the reset transistor is turned OFF. At this time, reset ends, and a voltage of the floating diffusion area VFD is maintained at a first sampled voltage, which is also referred to as a reset voltage.

At time t4, the RSEL signal is changed from the low voltage to the high voltage, the row selecting transistor NM2 is turned ON, and the first sampled voltage of the floating diffusion area is written to the upper electrode of the RRAM, that is, VA=VFD; the external voltage VB is decreased to a third voltage V3, and a difference between the third voltage V3 and the voltage of the upper electrode of the RRAM is greater than the voltage threshold of the RRAM. At this time, the change in the difference between the voltages of the upper electrode and the lower electrode of the RRAM makes the resistance value of the RRAM increased to a first resistance value R1, which may indicate a magnitude of the first sampled voltage. Thus, sampling of the first sampled voltage by the RRAM is finished.

At time t5, the RSEL signal is changed from the high voltage to the low voltage, and the row selecting transistor NM2 is turned OFF; the external voltage VB is increased to a second voltage V2 so as to ensure that a difference between the voltages of the upper electrode and the lower electrode of the RRAM is less than the voltage threshold of the RRAM. At this time, the resistance value R_rram is maintained at the first resistance value. A corresponding first sampled voltage may be obtained by reading the resistance value of the RRAM.

At time t6, the TX signal is changed from the low voltage to the high voltage, the transmission transistor is turned ON, charges generated by the photodiode in an exposure phase is transferred to the floating diffusion area, and the voltage of the floating diffusion area VFD is reduced to a second sampled voltage.

At time t7, the TX signal is changed from the high voltage to the low voltage, the transmission transistor is turned OFF, the voltage of the floating diffusion area is maintained at the second sampled voltage, and transferring of the charges generated by the photodiode is finished.

At time t8, the RSEL signal is changed from the low voltage to the high voltage, the row selecting transistor NM2 is turned ON, the second sampled voltage of the floating diffusion area is written to the upper electrode of the RRAM, and the external voltage VB is decreased to the third voltage V3, and a difference between the third voltage and the voltage of the upper electrode of the RRAM is greater than the voltage threshold of the RRAM. At this time, the change in the difference between the voltages of the two electrodes of the RRAM makes the resistance value of the RRAM changed to the second resistance value R2. The second resistance value R2 may indicate a magnitude of the second sampled voltage, and sampling of the second sampled voltage by the RRAM is finished.

At time t9, the RSEL signal is changed from the high voltage to the low voltage, and the row selecting transistor NM2 is turned OFF; the external voltage VB is increased to the second voltage V2 so as to ensure that the difference between the voltages of the two electrodes of the RRAM is less than the voltage threshold of the RRAM, then the resistance value of the RRAM is maintained at the second resistance value R2. A corresponding second sampled voltage may be obtained by reading the resistance value of the RRAM.

In addition, at time t10, the RX signal and TX signal may also be changed from the low voltage to the high voltage, the transmission transistor and the reset transistor are turned ON, and the external voltage is decreased to the second voltage V2, so that the circuit returns to the reset state for next exposure.

Figure 6:
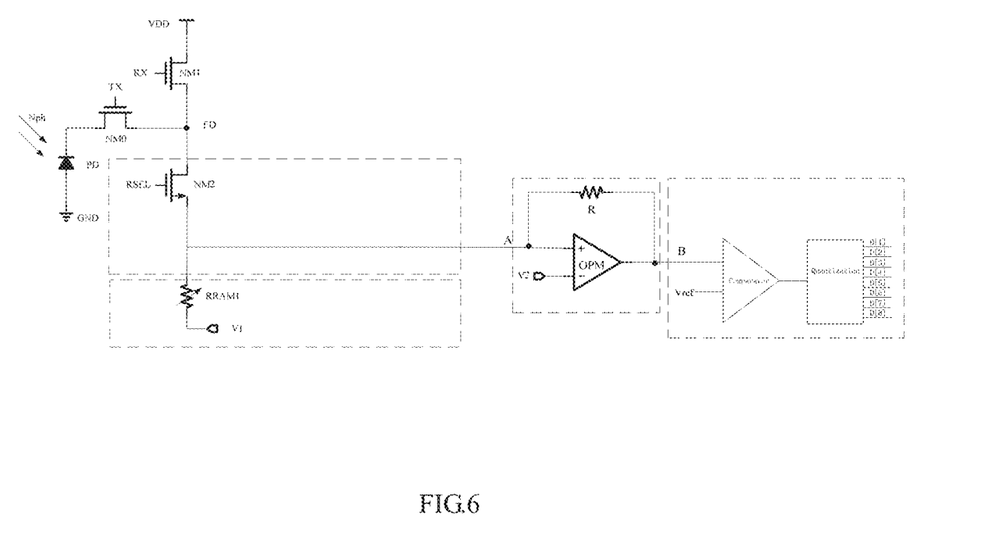
FIG. 6 illustrates a schematic view of a circuit structure of a CMOS image sensor according to an embodiment of the present disclosure.

Please continue to refer to FIGS. 1 and 6, the resistance-to-digital converting unit includes a resistance-to-voltage converting module and an analog-to-digital converting (ADC) module. The resistance-to-voltage converting module is configured to convert a resistance value into a voltage value, that is, a pixel signal in a form of voltage may be directly obtained by the resistance-to-voltage converting module. Specifically, the resistance-to-voltage converting module includes an operational amplifier and a resistor. The operational amplifier has a non-inverting input terminal, an inverting input terminal, and an output terminal, wherein the non-inverting input terminal is connected to the upper electrode of the RRAM, the inverting input terminal is connected to a reference voltage V2, and the resistor is connected cross the non-inverting input terminal and the output terminal. According to characteristics of the operational amplifier, a voltage of the non-inverting input terminal and a voltage the inverting input terminal are the same in a linear operation state, that is, a voltage VA at a node A is also V2.

In a case that the resistance value of the RRAM is required to be converted into a voltage value, the row selecting transistor NM2 is turned OFF, and the RRAM, the resistor and the operational amplifier form a resistor amplifier circuit. Assuming that the resistance value of the RRAM is RRAM1, the resistance of the resistor is R, at this time:

$$VA = V2, (VB - VA)/R = (VA - V1)/RRAM1; \text{ and then}$$

$$VB = VA + \frac{R}{RRAM1} \cdot (VA - V1)$$

where, V1 is the voltage of the lower electrode of the RRAM, VA is the voltage at the node A at the non-inverting input terminal of the operational amplifier, and VB is the voltage at the node B at the output terminal of the operational amplifier.

If V1 is set to 0, then $$VB = V2 + \frac{R}{RRAM1} \cdot V2$$

Therefore, the voltage VB output by the resistance-to-voltage converting module corresponds to the resistance value RRAM1 of the RRAM uniquely, that is, a converted voltage value varies unidirectionally with the resistance value of the RRAM.

The analog-to-digital converting module includes a comparator and a quantization circuit. The comparator is configured to compare the voltage VB with the reference voltage Vref, and inputs a comparison result into the quantization circuit to obtain a digital signal, thereby quantizing the resistance value of the RRAM, and the resistance value and the output digital signal vary unidirectionally, that is, a resistance value corresponds to a unique digital signal, and a digital signal corresponds to a unique resistance value. FIG. 6 illustrates analog-to-digital conversion of an 8-bit digital signal.

Figure 7:
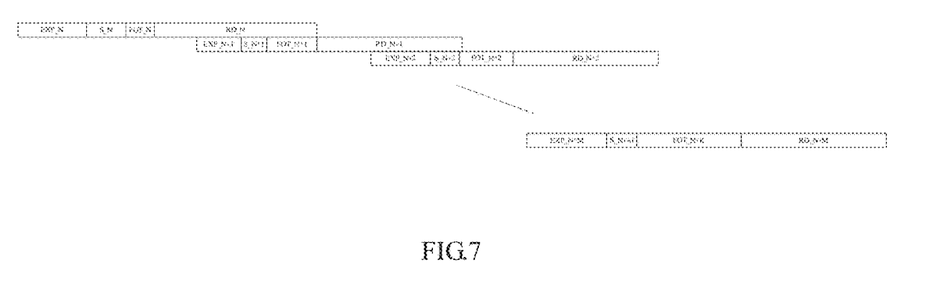
FIG. 7 illustrates a timing diagram of signal transmission of a CMOS image sensor according to an embodiment of the present disclosure.

For each of the plurality of image sensor units of the CMOS image sensor, there are mainly 4 operation states: exposing EXP, storing S, frame front FOT and reading RD. For each of the plurality of image sensor units, after the N-th frame image is exposed, analog electrical signals of the N-th frame image are stored in the RRAM, and then the operation of the image sensor unit is proceeded to the frame front, some registers are loaded, and then the resistance value of the RRAM is converted into a digital signal and is read. In an embodiment of the present disclosure, as illustrated in FIG. 6, each of the plurality of pixel units is connected correspondingly to a RRAM through a logic circuit, and after a reset signal and an exposure signal of each frame image are converted into digital signals and read out, a next frame image will be collected, as illustrated in FIG. 7.

Figure 8:
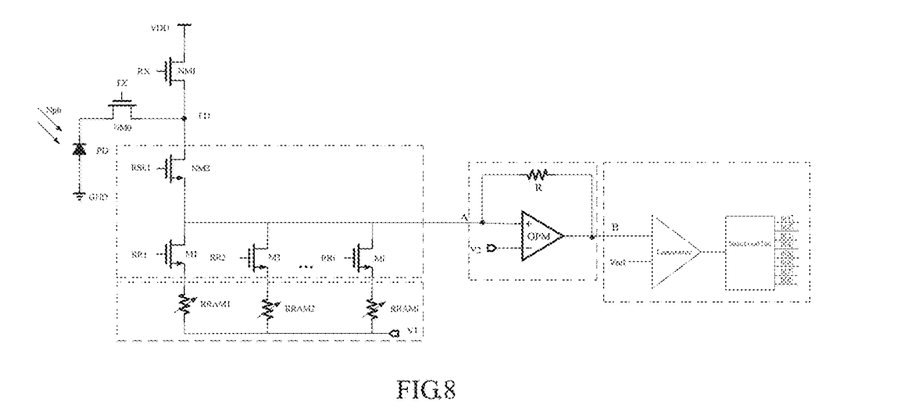
FIG. 8 illustrates a schematic view of a circuit structure of a CMOS image sensor according to another embodiment of the present disclosure.

In another embodiment of the present disclosure, as illustrated in FIG. 8, each of the plurality of pixel units is connected to a plurality of RRAMs through a logic circuit. It lies in that, during the actual signal transmission, even though an (N+1)-th frame image may be exposed after analog electrical signals of a N-th frame image are stored in the RRAM and the (N+1)-th frame image may be stored after the signals of the N-th frame image are converted into digital signals, the reading state is effected by a port output speed and the number of ports, data of a next frame image may not be read immediately after the signals of an individual pixel unit are read. For example, in a case that a frame image is exposed, after signals of a previous frame image are written to the RRAM and resistance-to-digital conversion is completed and digital signals are output, signals of a next frame image may be written to the current RRAM. Therefore, in a case that each of the plurality of pixel units corresponds to just one RRAM, exposure signals cannot be written to the RRAM before signals is read by a corresponding pixel unit, otherwise the signals of a previous frame image will be overwritten, which will impose a limit to the exposure frame rate in a great degree. In an embodiment of the present disclosure, each of the plurality of pixel units corresponds to a plurality of RRAMs, and a next frame image may be exposed immediately after the reset signal and the exposure signal of each frame image are read, and signals of various frame image are stored in various RRAMs, the resistance-to-digital signals are sequentially output frame by frame. After a frame image is exposed, signals of a previous frame image are written to a first RRAM, and a resistance value of the first RRAM is changed accordingly, and signals of a first frame image are stored. And then, the resistance information of the first RRAM is converted into a digital signal and output; after signals of the first frame image are stored in the first RRAM, the pixel unit immediately performs exposure of a second frame image without waiting for finishing of the output of digital conversion. In this way, for the structure in which each of the plurality of pixels corresponds to a plurality of RRAMs, each of the plurality of pixel units may independently carry out continuous exposure, and the entire exposure process is not affected by the output of the digital signals converted from the resistance value, and it is supported that signals of a plurality of frame images are saved and output one by one.

Referring to FIG. 8, in this embodiment, the logic circuit includes a row selecting transistor NM2 and a plurality of switching transistors M1~Mi, and the switching transistors M1~Mi are respectively connected to a RRAM RRAM1~RRAMi. The switching transistors are also MOS transistors. A gate signal RSEL of the row selecting transistor NM2 and a gate signal of the switching transistor Mi control writing voltage signals to the i-th RRAM RRAMi, and the switching transistor Mi further controls reading of resistance information of the i-th RRAM RRAMi.

Figure 9:
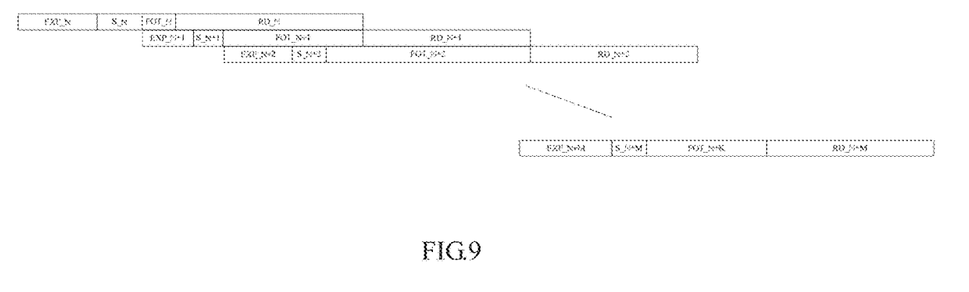
FIG. 9 illustrates a timing diagram of signal transmission of a CMOS image sensor according to another embodiment of the present disclosure.

The principle of the resistance-to-voltage conversion of a single RRAM in FIG. 8 is the same as that in the embodiment illustrated in FIG. 6, and will not be elaborated here. Referring to FIG. 9, for each of the plurality of image sensor units, exposure of the first frame image ends, analog electrical signals of the first frame image are stored in the RRAM RRAM1, and then processing is proceeded to the frame front, some registers are loaded and then a second frame image is exposed, signals of the second frame image are written to the RRAM RRAM2, and then a third frame image is exposed. With respect to the reading state, data of the second frame image is read immediately after data of the first frame image is read. Thus, the exposure and the storing are not affected by the reading state, image information may be captured with a high frame rate, and more dynamic image details may be captured.

It should be noted that the CMOS image sensor according to the present disclosure can realize not only a rolling shutter progressive exposure, but also a global exposure.

Preferably, respective pixel units of the plurality of image sensor units of the CMOS image sensor are arranged in array so as to form a pixel unit array.

In the mode of the rolling shutter progressive exposure, for a current frame image, the control unit selects respective rows of the pixel unit array sequentially, and controls pixel units of a selected row to simultaneously output signals to a correspondingly connected RRAM. Specifically, the control unit sends out corresponding RX and TX signals to control pixel units of each row to be exposed, and sends out a corresponding RSEL signal to control output signals of the pixel units of a selected row to be stored in the RRAM, and signals of respective rows to be stored in the respective RRAMs sequentially. Specifically, in an exposure stage, a second row is selected to be exposed after a first row is exposed, a third row is selected to be exposed after the second row is exposed, and so on, so as to complete the exposure of the entire image. In a reading stage, the second row is read after the first row is read, the third row is read after the second row is read, and so on to complete reading signals of the entire image. For the entire image, the exposure stage and the reading stage may or may not overlap.

In the mode of the global exposure, for a current frame image, the control unit selects respective rows of the pixel unit array at the same time, controls pixel units of a selected row to simultaneously output signals to the corresponding connected RRAM, and controls the resistance value stored in the respective RRAM connected to the pixel units of the respective rows to be sequentially output to a correspondingly connected resistance-to-digital converting unit. Specifically, gates of the transmission transistors of all the pixel units are connected together and controlled by the TX signal. That is, all the pixel units are exposed and transmit signals at the same time, and the exposure signals are stored in the correspondingly connected RRAM at the same time. At the reading stage, the signals of respective rows are read row by row, that is, the signals of the first row are first read, and then the signals of the second row are read, and then the signals of the third row are read, and so on, to complete reading of the entire image. After all the signals of the current frame image are read, the next frame image is exposed. In the mode of the global exposure, the exposure stage and the reading stage cannot overlap. The CMOS image sensor with global exposure function according to the present disclosure may reduce a size of the current global pixel unit and improve the sensitivity of the global pixel unit.

Figure 10:
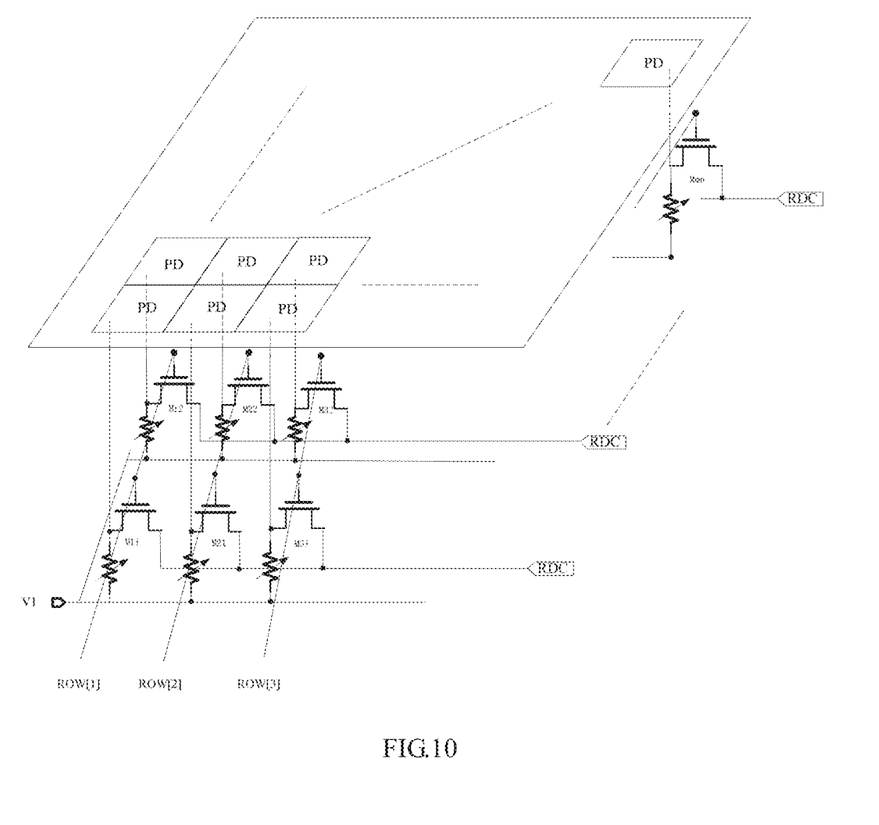
FIG. 10 illustrates a schematic connection view of a CMOS image sensor with a pixel unit array according to the present disclosure.

Please refer to FIG. 10. FIG. 10 illustrates a schematic connection view of a CMOS image sensor with an m*n pixel unit array. In this embodiment, the pixel units correspond to the RRAMs in a one-to-one correspondence. The logic circuit further includes an output selecting MOS transistor configured to control output of the resistance value of the RRAM. A lower electrode of each RRAM is connected to a variable external voltage V1, and an upper electrode of each RRAM is connected to an output selecting MOS transistor. Another terminal of the output selecting MOS transistors of each column are connected to a RDC unit, that is, each column of the pixel unit array corresponds to a resistance-to-digital converting unit RDC. Gates of the output selecting MOS transistors of each row are connected together and are connected to a row selecting signal ROW. The row selecting signal ROW can also be sent by the control unit. Starting from the first row, the first row selecting signal ROW[1] is a high voltage, the remaining row selecting signals are low voltages, the output selecting MOS transistor M1j (j=1, 2, . . . , n) is turned ON, and the output selecting MOS transistors of remaining rows are not turned ON, a RRAM corresponding to the first row is connected to the resistance-to-digital converting module and a resistance value thereof is converted to a digital signal so as to be output, and next, the first row selecting signal ROW[1] is changed from the high voltage to the low voltage, the second row selecting signal ROW[2] is changed from the low voltage to the high voltage, and the output selecting MOS transistor M2j (j=1, 2, . . . , n) is turned ON, the output selecting MOS transistors of remaining rows are not turned ON, a RRAM corresponding to the second row is connected to the resistance-to-digital converting module and a resistance thereof is converted to a digital signal so as to be output. Continuing in sequence, from the first row to the last row, the resistance information of the RRAM is sequentially converted into corresponding digital signals, and the entire image is quantized and output. When output of the last row is finished, data of the frame image is quantized and transmitted, and then data of a second frame image starts to be quantized and transmitted. For one of ordinary skill in the art, although the transmission of a frame image of one resistance-to-digital converting unit of each row is just described in this embodiment, the resistance-to-digital converting units and the pixel units may correspond to each other in one-to-one correspondence, or, pixel units of one row correspond to a resistance-to-digital converting unit.

In summary, the pixel units of the CMOS image sensor according to the present disclosure adopt a RRAM to replace a transistor device occupying a relatively large area, without occupying the area of the active area, can increase the filling ratio, and improve the sensitivity of the image sensor. In addition, the present disclosure further proposes a new resistance quantization architecture, which converts the resistance information of the resistive random access memory into a digital signal and outputs, thereby completing the digital quantization of the image information.

The above are only the embodiments of the present disclosure, and the embodiments are not intended to limit the protection scope of the present disclosure. Therefore, all equivalent structures derived from the description and the drawings of the present disclosure falls into the protection scope of the present disclosure.

What is claimed is:

1. A CMOS image sensor, comprising:
a plurality of image sensor units, each of the plurality of image sensor units comprising a pixel unit and a resistive random access memory unit (RRAM unit) connected to the pixel unit, the pixel unit configured to convert a received optical signal into an analog electrical signal and output the analog electrical signal, and the RRAM unit configured to convert the analog electrical signal into a resistance value; and
a resistance-to-digital converting (RDC) unit, connected to the plurality of the image sensor units and configured to convert the resistance value into a digital signal; wherein the RDC unit comprises a resistance-to-voltage converting (RDC) module configured to convert the resistance value into a voltage value and an analog-to-digital converting module configured to convert the voltage value into a digital signal.

2. The CMOS image sensor according to claim 1, wherein:
the RRAM unit comprises at least one resistive random access memory (RRAM) and a logic circuit configured to control reading and writing of the at least one RRAM, an upper electrode of the RRAM is connected to an output terminal of the logic circuit, and a lower electrode of the RRAM is connected to a variable external voltage.

3. The CMOS image sensor according to claim 2, wherein the pixel unit comprises a photodiode, a transmission transistor, and a reset transistor, a source of the transmission transistor is connected to the photodiode, both a drain of the transmission transistor and a source of the reset transistor are connected to a floating diffusion area, and an input terminal of the logic circuit is connected to the floating diffusion area.

4. The CMOS image sensor according to claim 3, wherein: the logic circuit comprises a row selecting transistor, a drain of the row selecting transistor is connected to the floating diffusion area, and a source of the row selecting transistor is connected to the upper electrode of the RRAM.

5. The CMOS image sensor according to claim 2, wherein the pixel unit is correspondingly connected to one of the at least one RRAM through the logic circuit.

6. The CMOS image sensor according to claim 2, wherein the pixel unit is correspondingly connected to more than one of the at least one RRAM through the logic circuit.

7. The CMOS image sensor according to claim 6, wherein the logic circuit further comprises a plurality of switching transistors connected to the row selecting transistor, wherein the plurality of switching transistors are connected to more than one of the at least one RRAM in one-to-one correspondence.

8. The CMOS image sensor according to claim 5, wherein the pixel units of the plurality of image sensor units are arranged in array,
the CMOS image sensor further comprises a control unit, for a frame image, the control unit sequentially selects each row of the pixel unit array, and controls the pixel units of a selected row to simultaneously output the analog electrical signal to the RRAM correspondingly connected.

9. The CMOS image sensor according to claim 5 or 6, wherein the pixel units of the plurality of image sensor units are arranged in array, the CMOS image sensor further comprises a control unit, for a frame image, the control unit selects respective rows of the pixel unit array at the same time, and controls the pixel units of the selected respective rows to simultaneously output an analog electrical signal to the RRAMs correspondingly connected, and controls the resistance values stored in the RRAMs respectively connected to the pixel units of the selected respective rows to be output sequentially to the RDC unit correspondingly connected.

10. The CMOS image sensor according to claim 1, wherein the resistance-to-voltage converting module comprises:

an operational amplifier, comprising a first input terminal, a second input terminal, and an output terminal, the first input terminal connected to the upper electrode of the RRAM; and a resistor, connected across the first input terminal and the output terminal of the operational amplifier.

11. A signal transmission method for a CMOS image sensor according to claim 1, wherein the pixel units of the plurality of image sensor units are arranged in array, and the signal transmission method comprises:

selecting each row of the pixel units arranged in array sequentially, and controlling the pixel units of the selected row to simultaneously output analog electrical signals to the RRAM correspondingly connected.

12. The signal transmission method of a CMOS image sensor according to claim 1, wherein the pixel units of the plurality of image sensor units are arranged in array, and the signal transmission method comprises:

selecting respective rows of the pixel unit array at the same time, controlling the pixel units of the selected respective rows to simultaneously output an analog electrical signal to the correspondingly connected RRAM, and controlling a resistance value stored in respective RRAMs connected to the pixel units of the selected respective rows to be output sequentially to the resistance-to-digit converting unit correspondingly connected.

13. An image sensor unit, comprising:

a pixel unit, comprising a photodiode, a transmission transistor, and a reset transistor; the photodiode configured to convert received optical signal into an analog electrical signal, a source of the transmission transistor connected to the photodiode, and both a drain of the transmission transistor and a source of the reset transistor are connected to a floating diffusion area; and a resistive random access memory unit (RRAM unit) connected to the pixel unit, the RRAM unit comprising at least one resistive random access memory (RRAM) configured to convert the analog electrical signal into a resistance value and a logic circuit configured to control reading and writing of the at least one RRAM, an input terminal of the logic circuit connected to the floating diffusion area, and an output terminal of the logic circuit connected to an upper electrode of the RRAM, and a lower electrode of the RRAM connected to a variable external voltage.

14. The image sensor unit according to claim 13, wherein the logic circuit comprises a row selecting transistor, a drain of the row selecting transistor is connected to the floating diffusion area, and a source of the row selecting transistor is connected to the upper electrode of the RRAM.

15. The image sensor unit according to claim 14, wherein the logic circuit further comprises a plurality of switching transistors connected to the row selecting transistor, wherein the plurality of switching transistors are connected to the RRAM in one-to-one correspondence.

16. A signal transmission method for the image sensor unit according to claim 13, comprising following steps:

S1: turning on the transmission transistor and the reset transistor to make the photodiode in a reset state; setting a voltage of a lower electrode of the RRAM to a first voltage;

S2: turning off the transmission transistor, and the photodiode starting to be exposed;

S3: increasing the voltage of the lower electrode of the RRAM to a second voltage, wherein a difference between the second voltage and a voltage of the upper electrode of the RRAM is less than a voltage threshold at which a resistance state of the RRAM is changed;

S4: turning off the reset transistor, and maintaining a voltage of the floating diffusion region at a first sampled voltage;

S5: writing the first sampled voltage to the upper electrode of the RRAM and maintaining;

S6: reading a first resistance value of the RRAM, wherein the first resistance value corresponds to the first sampled voltage;

S7: turning on the transmission transistor to reduce the voltage of the floating diffusion area to a second sampled voltage;

S8: turning off the transmission transistor;

S9: writing the second sampled voltage to the RRAM and maintaining; and

S10: reading a second resistance value of the RRAM, wherein the second resistance value corresponds to the second sampled voltage.

17. The signal transmission method of claim 16, wherein:

Step S5 comprises:

S51: controlling the logic circuit to write the first sampled voltage to the RRAM, and decreasing the voltage of the lower electrode of the RRAM to a third voltage, wherein a difference between the third voltage and the voltage of the upper electrode of the RRAM is greater than the voltage threshold;

S52: increasing the voltage of the lower electrode of the RRAM to the second voltage, so that a difference between the voltage of the upper electrode and the voltage of the lower electrode of the RRAM is less than the voltage threshold;

Step S9 comprises:

S91: controlling the logic circuit to write the second sampled voltage into the RRAM, and decreasing the voltage of the lower electrode of the RRAM to the third voltage; and S92: increasing the voltage of the lower electrode of the RRAM to the second voltage, so that the difference between the voltage of the upper electrode and the voltage of the lower electrode of the RRAM is less than the voltage threshold.

18. A signal transmission method for the image sensor unit according to claim 13, comprising following steps:

S1: turning on the transmission transistor and the reset transistor to make the photodiode in a reset state; and setting a voltage of the lower electrode of the RRAM to a first voltage;

S2: turning off the transmission transistor, and the photodiode starting to be exposed;

S3: increasing the voltage of the lower electrode of the RRAM to a second voltage, wherein a difference between the second voltage and the voltage of the upper electrode of the RRAM is less than the voltage threshold at which a resistance state of the RRAM is changed;

S4: turning off the reset transistor, and maintaining a voltage value of the floating diffusion area at a first sampled voltage;

S5: writing the first sampled voltage to the upper electrode of the RRAM and maintaining;

S6: reading a first resistance value of the RRAM, wherein the first resistance value corresponds to the first sampled voltage;

S7: turning on the transmission transistor to decrease the voltage of the floating diffusion area to a second sampled voltage;

S8: turning off the transmission transistor;

S9: writing the second sampled voltage to the RRAM and maintaining; and

S10: reading a second resistance value of the RRAM, wherein the second resistance value corresponds to the second sampled voltage.

19. The signal transmission method according to claim 18, wherein step S5 comprises:

S51: turning on the row selecting transistor, writing the first sampled voltage to the RRAM, and decreasing the voltage of the lower electrode of the RRAM to a third voltage, wherein a difference between the third voltage and the voltage of upper electrode of the RRAM is greater than the voltage threshold;

S52: turning off the row selecting transistor, and increasing the voltage of the lower electrode of the RRAM to the second voltage, so that a difference between the voltage of the upper electrode of the RRAM and the voltage of the lower electrode of the RRAM is less than the threshold voltage;

Step S9 comprises:

S91: turning on the row selecting transistor, writing the second sampled voltage to the RRAM, and decreasing the voltage of the lower electrode of the RRAM to the third voltage; and S92: turning off the row selecting transistor, and increasing the voltage of the lower electrode of the RRAM to the second voltage, so that the difference between the voltage of the upper electrode of the RRAM and the voltage of the lower electrode of the RRAM is less than the voltage threshold.

20. The signal transmission method according to claim 16, further comprising:

S11: turning on the transfer transistor and the reset transistor, and decreasing the voltage of the lower electrode of the RRAM to the first voltage.

* * * * *